United States Patent [19]

Chapel, Jr. et al.

[11] 4,346,291

[45] Aug. 24, 1982

[54] THERMALLY ISOLATED MONOLITHIC SEMICONDUCTOR DIE

[75] Inventors: Roy W. Chapel, Jr., Edmonds; I. Macit Gurol, Seattle, both of Wash.

[73] Assignee: John Fluke Mfg. Co., Inc., Everett, Wash.

[21] Appl. No.: 182,966

[22] Filed: Sep. 2, 1980

Related U.S. Application Data

[62] Division of Ser. No. 842,972, Oct. 17, 1977.

[51] Int. Cl.$^3$ .............................................. G06G 7/20
[52] U.S. Cl. .............................. 250/211 R; 250/338; 307/261
[58] Field of Search ................ 250/211 R, 211 J, 210, 250/338; 307/261; 357/29; 73/355 R, 355 EM

[56] References Cited

U.S. PATENT DOCUMENTS 3,668,428  6/1972  Koerner ........................ 307/310 X Primary Examiner—David C. Nelms
Assistant Examiner—Darwin R. Hostetter
Attorney, Agent, or Firm—Christensen, O'Connor, Johnson & Kindness

[57] ABSTRACT

A process for producing thermally isolated semiconductor die and die produced by the process, plus improved apparatus using the die are disclosed. The process generally comprises the steps of: forming a desired semiconductor component or circuit in a semiconductor wafer (preferably a silicon wafer of <100> crystal orientation) having a protective layer (SiO$_2$) on one surface; forming platinum silicide contact windows in said protective layer where external connections to the semiconductor component or circuit is necessary; forming support leads of a layer of adhesive material (which also may have resistive properties, such as Nichrome) and a layer of a structurally strong metal of high electrical conductivity and low thermal conductivity (preferably 304 stainless steel) along predetermined paths extending outwardly toward the edge of the die from said contact windows; simultaneously with the forming of the adhesive layer of said support leads, forming one or more thin film resistors in predetermined regions of said die atop said SiO$_2$ protective layer, if desired; removing said SiO$_2$ protective layer from a region defined by said support leads, an island or islands in which said semiconductor component or circuit and said resistors are formed and a surrounding frame; and, removing said silicon from the region between said island or islands and said frame. The resulting semiconductor die comprises a frame surrounding one or more islands in which semiconductor components or circuits are formed, and which support resistors, if included. The islands are entirely supported by the support leads extending between the frame and the islands. In addition to providing support, the support leads also provide for electrical connection to the semiconductor components or circuits and to the resistors. The semiconductor die may be mounted in a package that also forms part of the invention. The package includes a ceramic substrate having an aperture in its center and alignment mesas and ridges on one surface. The ceramic substrate is formed so as to be mounted on the metal header of a conventional semiconductor canister housing. Depending upon their specific nature the resulting die are useful in and/or improve a variety of electrical apparatus. They are particularly useful as the dual RMS sensor element of an RMS converter. They can also be formed so as to be useful as radiation sensors. Or, they can be formed so as to provide a thermal platform whose temperature is controlled and stabilized at a predetermined value. All of these dies and the improved circuits resulting from their use also form part of the invention.

21 Claims, 9 Drawing Figures

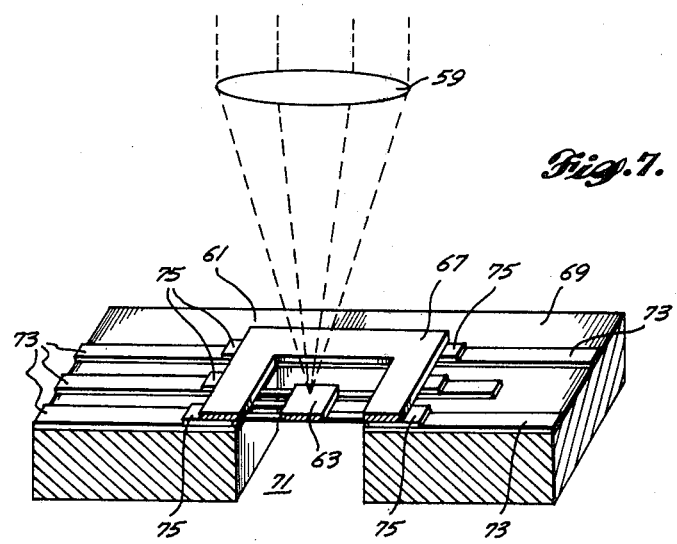
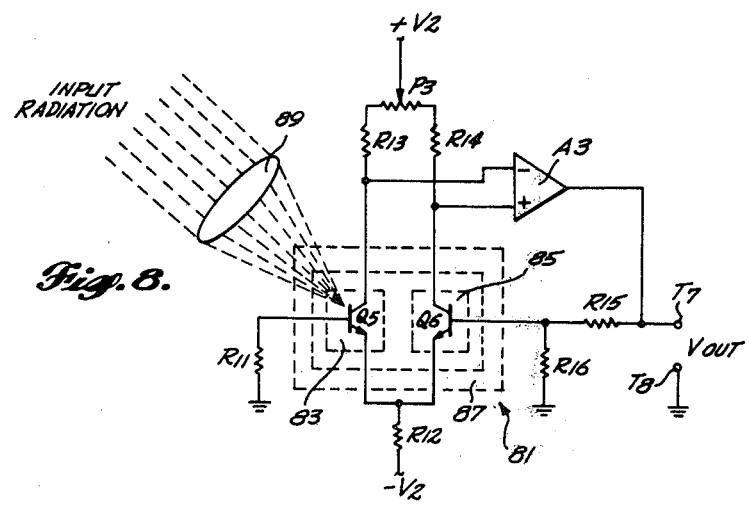
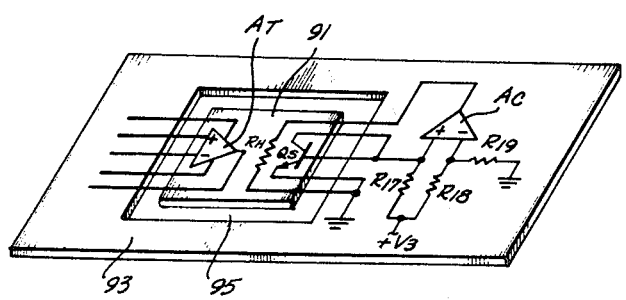

THERMALLY ISOLATED MONOLITHIC SEMICONDUCTOR DIE

This is a divisional of application Ser. No. 842,972, filed on Oct. 17, 1977.

BACKGROUND OF THE INVENTION

This invention is directed to semiconductors and, more particularly, monolithic semiconductors and electrical apparatus using such semiconductors.

In the past, most semiconductor dies have required good thermal coupling between the die and the surrounding environment in order to keep the temperature of the dies from rising to an undesirably high level. In many cases, the thermal coupling extends to a heat sink adapted to dissipate heat to the surrounding environment. In some cases the requirement for good thermal coupling must be traded off against an opposing requirement for good electrical isolation. That is, in many cases, good thermal coupling and good electrical isolation are mutually exclusive requirements. Thus, improved electrical isolation can only be obtained by reducing the thermal coupling requirement. Usually, in these cases, the trade off results in moderate thermal coupling being obtained, even though it may prove to be inadequate under some circumstances. In any event, most prior art semiconductor die have the best thermal coupling available considering the various trade offs that must be made. Conversely stated prior art semiconductor die have poor thermal isolation. The present invention is directed to semiconductor die that have a diametrically opposed thermal requirement. That is, the present invention is directed to semiconductor die that have good thermal isolation, rather than poor thermal isolation. Or, conversely stated, semiconductor die having poor thermal coupling to the surrounding environment.

In the past, when good thermal isolation was a requirement of a circuit or system, the usual solution has been to form a hybrid circuit using techniques designed to thermally isolate a silicon chip or die from the external ambient environment. Because discrete elements are involved, this approach has necessitated the use of relatively large geometry supporting and attachment structures. The inclusion of such structures tends to defeat the good thermal isolation requirement because such structures inherently produce larger than desired heat flows between the isolated portion of the overall circuit or system and the external environment. Moreover, the thermal capacity of such structures is usually higher than desired, also because of the relatively large geometries of the elements used to form the structures. Further, because discrete elements are attached together, it is extremely difficult to reliably and inexpensively yield pairs of matched devices, when matched devices are required. As a result, circuits using such devices have, in the past, not been as accurate as desired. Or, if accurate to an adequate degree, have been more expensive than desirable.

Therefore, it is an object of this invention to provide new and improved thermally isolated electrical devices and processes for making such devices.

It is also an object of this invention to provide thermally isolated electrical devices that include matched elements and processes for making such devices.

It is a further object of this invention to provide thermally isolated semiconductor dies and processes for making such dies.

It is another object of this invention to provide thermally isolated monolithic semiconductor dies and processes for making such dies.

It is a still further object of this invention to provide thermally isolated monolithic semiconductor dies having matched regions and processes for making such dies.

It is still another object of this invention to provide new and improved semiconductor circuits including thermally isolated monolithic semiconductor dies.

SUMMARY OF THE INVENTION

The present invention has a number of different aspects. These aspects include a process for producing thermally isolated monolithic semiconductor dies, the resultant dies and improved circuits using the dies. The process of the invention starts with a semiconductor wafer, preferably a silicon wafer having a $<100>$ crystal orientation, having formed therein, by any of several well known techniques, a desired semiconductor element (e.g., transistor) or circuit (e.g., operational amplifier). The semiconductor wafer has a protective layer on one surface and the required number of contact windows formed in the protective layer. Suitable contacts are formed in the windows. The process of the invention involves forming support leads of layers of an adhesive material and a structurally strong metal along predetermined paths extending outwardly from said contact windows. The structurally strong metal has high electrical conductivity and low thermal conductivity. The adhesive material and metal layers may be deposited in any conventional manner, e.g., sputter deposition, vacuum with plating etc., undesired material removed by etching, as necessary. After the support beams are formed the protective layer is removed from between the support leads in a region generally defined by an island or islands and a surrounding frame. Next the silicon is removed from between the island(s) and the frame. The resultant die is an island or islands surrounded by a frame, with the island or islands entirely supported by the support leads. The support leads provide electrical connection to the semiconductor component or circuit formed in the islands. In addition, as necessary, thin film resistors may be formed on each island simultaneously with the formation of the adhesive layer of the support leads, if the adhesive layer chosen has adequate resistive properties, and connected via similarily formed support leads to the frame. An adhesive material having suitable resistive properties is nichrome. Formed atop the support leads in the frame region are metallic bonding pads adapted to provide easy connection to other elements such as the pins of a housing.

In accordance with the invention, the semiconductor die may be supported by a ceramic substrate and the substrate mounted on the header of a semiconductor cannister. Preferably, the ceramic substrate is apertured beneath the islands and includes mesas and ridges that allow the die to be quickly and rapidly aligned. Moreover, the ceramic substrate is formed such that it is quickly and easily oriented on the header. In a conventional manner, terminal pins passing through the header are connected by wires to the bonding pads formed atop the support leads in the region of the frame.

One specific embodiment of a semiconductor die formed in accordance with the invention includes two islands. Each island includes a heat sensitive transistor and a resistor. This embodiment is particularly useful to provide an improved RMS convertor. More specifically, this embodiment forms an improved dual RMS sensor that results in an improved RMS convertor when approximately connected. In this regard, one of the island resistors is connected to receive electrical energy from the source whose RMS value is to be converted. The transistors are connected in a bridge circuit arrangement with a pair of other resistors and the bridge circuit is connected to the inverting and non-inverting inputs of an operational amplifier. The output of the operational amplifier is connected to the resistor of the other island. When the circuit is balanced, the magnitude of the DC voltage applied to one island resistor by the output of the operational amplifier is equal to the RMS value of the voltage applied to the other island resistor by the source whose RMS value is to be converted.

A semiconductor die including two identical islands each including a heat sensitive transistor and a resistor can also be utilized in a similar circuit arrangement to provide a radiation sensor. In this apparatus, rather than one island resistor being connected to a power source whose RMS value is to be converted, the input radiaion is directed onto the island where that resistor is located and the resistor is left unconnected. When balance is achieved, the voltage applied by the operational amplifier to the resistor of the other island is equal to the RMS value of the input radiation. Still further, in accordance with the invention, a radiation sensor of this general type is formed with only the transistors being located in the islands, i.e., the resistors are eliminated.

Preferably sensor embodiments of the invention comprising resistor and semiconductor component (e.g., transistor) island arrangements include a capacitive coupling guard located between the resistors and the semiconductor components. In its preferred form the guard comprises an elbow formed with the support lead attached to one end of the resistor. The elbow lies between the resistor and the semiconductor component. By connecting the related resistor support lead and one terminal of the semiconductor component (e.g., the base) to ground, a ground potential is formed around the significant semiconductor junction (e.g., the emitter-base junction). As a result resistor-semiconductor junction capacitive coupling effects, which could create an erroneous output, are reduced.

A single island arrangement formed in accordance with the invention is useful when it is desired to provide a thermal platform for maintaining the temperature of a semiconductor circuit or component constant. In addition to the semiconductor circuit or component, the platform includes a temperature sensitive transistor and a resistor. The temperature sensitive transistor senses the temperature of the island. The output of the temperature sensitive transistor is compared with a fixed voltage (produced by a voltage drop across a fixed resistor) by an operational amplifier and the output of the operational amplifier controls the power applied to the resistor mounted on the island. In this manner, the island temperature is maintained at a predetermined level whereby the island forms a thermally isolated platform whose temperature is maintained constant.

It will be appreciated from the foregoing summary that semiconductor dies formed in accordance with the invention include thermally isolated islands. Because the dies are monolithic, the characteristics of a pair of islands are easily matched. The inclusion of a surrounding frame thermally balances the ends of the support leads whereby thermal emf effects are substantially reduced, if not entirely eliminated. The frame also results in ambient temperature changes having a common mode effect on the islands. As a result, circuits using semiconductor dies formed in accordance with the invention, such as RMS converters are substantially improved. The invention not only provides improved dies, it also provides an improved packaging arrangement for the dies that further enhance the overall benefits achieved. The mesas and ridges located atop the ceramic support allow a die to be readily and rapidly aligned. The aperture in the support beneath the island or islands can be deep enough to create a substantial distance separation between the islands and the nearest adjacent surface, whereby the mean free path for any included gas molecules surrounding the islands is large. Since the mean free path is relatively large, a cannister housing the overall structure does not have to be evacuated to the degree it would have to be to achieve the same result if the mean free path were smaller.

While various adhesive materials and metals can be used to form the support beams, preferably the adhesive material, when resistive properties are desired, is nichrome and the structurally strong metal is 304 stainless steel. When resistive properties are not significant to the adhesive layer, materials such as chrome or titanium can be used. Moreover, the materials used to form the support leads should be chosen such that the figure of merit (tensil strength/thermal conductivity) of the support leads is no less than 2,000, when tensil strength is given in terms of pounds per square inch (lbs/in$^2$) and thermal conductivity is given in terms of BTU per square foot, hours, degrees Fahrenheit per foot (BTU/ft$^2$ hr° F./ft). A further restriction is that the electrical resistivity ($\rho$) should be no more than 300 microhm-centimeters. Also, while the bonding pads lying atop the support means in the region of the frame can be formed by various metals, the preferred metals are a layer of platinum followed by a layer of gold.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein:

FIG. 7 is a partial, isometric view of a mechanism for mounting radiation sensors formed in accordance with the invention;

FIG. 8 is a schematic diagram of an alternative embodiment of a radiation detector including a radiation sensor formed in accordance with the invention; and, FIG. 9 is an isometric view of a thermal platform formed in accordance with the invention with various items shown in schematic form.

DESCRIPTION OF THE PREFERRED EMBODIMENTS

Since semiconductor die formed in accordance with the invention and the process for making such die will be better understood if the die are considered in combination with a circuit utilizing such die, prior to describing in detail the process and the specific nature of the die, such a circuit is first described. In this regard, attention is directed to FIG. 1 which illustrates, in schematic form, an RMS converter.

Figure 1:
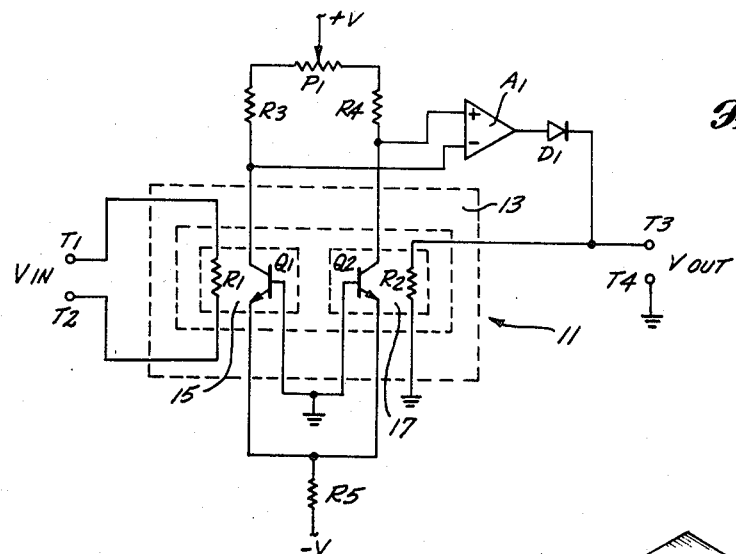
FIG. 1 is a schematic diagram of an RMS converter including a dual RMS sensor formed in accordance with the invention.

The RMS converter illustrated in FIG. 1 includes: five resistors designated R1, R2, R3, R4 and R5; two NPN transistors designated Q1 and Q2; a potentiometer designated P1; an operational amplifier designated A1; and, a diode designated D1. The resistance of R1 equals the resistance of R2; the resistance of R3 equals the resistance of R4; and, Q1 and Q2 are matched. R1 and Q1, and R2 and Q2, are thermally coupled such that Q1 is sensitive to the heat produced by current flow through R1 and Q2 is sensitive to the heat produced by current flow through R2. R1/Q1 and R2/Q2 are sometimes known as a dual RMS sensor.

A pair of input terminals designated T1 and T2 are connected to the opposite ends of R1. The emitters of Q1 and Q2 are connected together and through R5 to a negative voltage source designated −V. The bases of Q1 and Q2 are connected together and to ground. The collector of Q1 is connected to one end of R3 and to the inverting input of A1. The collector of Q2 is connected to one end of R4 and to the non-inverting input of A1. The other ends of R3 and R4 are each connected to one end of P1. The movable element of P1 is connected to a positive voltage source designated +V. The output of A1 is connected to the anode of D1. The cathode of D1 is connected to an output terminal designated T3 and to one end of R2. The other end of R2 is connected to ground. The output voltage ($V_{OUT}$) is taken across T3 and a ground output terminal designated T4.

In operation, R1 generates heat in accordance with the RMS magnitude of a voltage applied across T1 and T2, designated $V_{IN}$. The heat produced by R1 controls the emitter-base voltage drop across Q1, which controls the voltage at the collector of Q1. A1 compares the voltage at the collector of Q1 with the voltage at the collector Q2. In accordance therewith, A1 applies a balancing current to R2. The heat generated by R2 controls the emitter-base voltage drop of Q2 in the same manner that the heat produced by R1 controls the emitter-base voltage drop of Q1. When balance is achieved, the DC voltage drop across R2, read across the output terminals T3/T4, is equal to the RMS value of the voltage drop across R1, i.e., $V_{OUT}$(DC) is equal to $V_{IN}$(RMS).

As will readily be appreciated by those familiar with RMS converters, circuits similar to the circuit illustrated in FIG. 1 and just described (i.e., circuits using RMS sensors, usually dual, including temperature generating elements and temperature sensors) were known prior to the present invention. In this regard, attention is directed to U.S. Pat. Nos. 3,668,428 issued to Henry Koerner for "Root Mean Square Measuring Circuit"; 3,624,525 issued to William G. Smith for "True RMS Converter"; 3,521,165 issued to Aget Visser for "Meter for Measuring RMS Values for Pulse Current Signals"; 3,435,319 issued to Peter L. Richman for "Thermal RMS Converter with Feedback to Control Operating Point"; 3,321,716 issued to R. Lyon-Caen for "Thermally Coupled Electronic Circuits"; 3,267,376 issued to W. Harries for "Electric Measurement Apparatus Using a Pair of Oppositely Poled Thermal Electric Junctions in Parallel and Diode Stabilizing Means".

The present invention provides improved RMS converters. One type of RMS converter improved by the invention is illustrated in FIG. 1; and, others will be apparent to those skilled in the art. The improvement is provided by forming the dual RMS sensor, i.e., R1/Q1 and R2/Q2, as a single unit using monolithic semiconductor techniques. As illustrated by the dashed lines in FIG. 1, the dual RMS sensor 11 includes a frame 13 surrounding a pair of islands 15 and 17. One island 15 is a sensing island and the other island is a balancing island. The sensing island has Q1 formed therein, and supports R1. The balancing island has Q2 formed therein, and supports R2. The islands are identical, as will be better understood from the following discussion.

Figure 2:
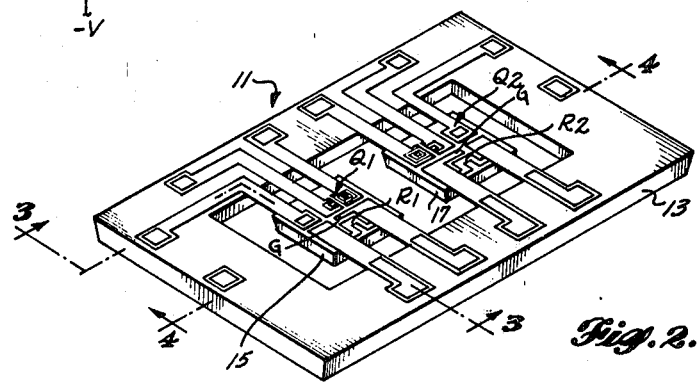
FIG. 2 is a perspective view of a dual RMS sensor semiconductor die formed in accordance with the invention.
Figure 3:
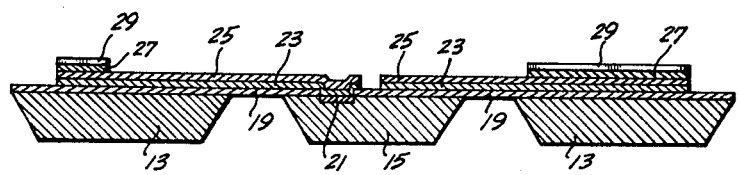
FIG. 3 is a cross-sectional view along line 3—3 of FIG. 2.
Figure 4:
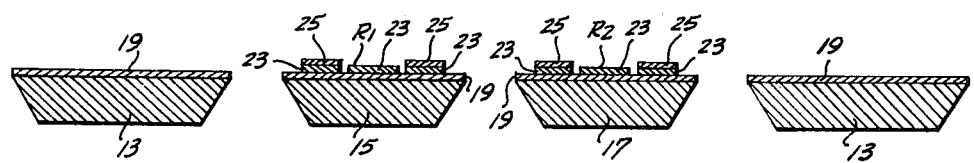
FIG. 4 is a cross-sectional view along line 4—4 of FIG. 2.
Figure 5:
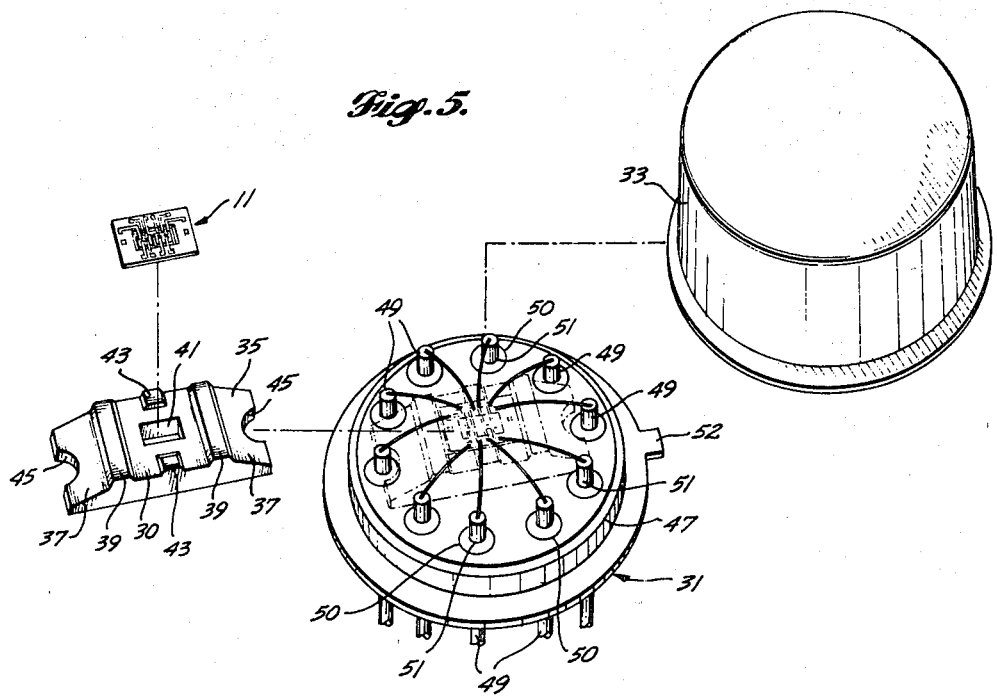
FIG. 5 is an exploded, isometric view of a semiconductor die of the type illustrated in FIG. 2 mounted in a semiconductor cannister in accordance with the invention.

FIGS. 2-4 illustrate a dual RMS sensor thermally isolated monolithic semiconductor suitable for use in an RMS converter of the type illustrated in FIG. 1, formed in accordance with the invention. FIG. 5 illustrates the dual RMS sensor die packaged in a semiconductor cannister that can be readily evacuated to provide improved thermal isolation. The dual RMS sensor die illustrated in FIGS. 2-4 includes the frame 13 and the islands 15 and 17. The frame and the islands are both formed from a common wafer, preferably a <100> silicon wafer, in the manner hereinafter described. The islands 15 and 17 are entirely supported by support leads that extend across the air or vacuum gap between the islands and the surrounding frame. A support lead exists for each required electrical connection. Thus, each island is supported by five support leads, three for the base, emitter and collector terminals of the NPN transistor and two for the resistor terminals. Covering the support leads where they overlie the frames are bonding pads. The bonding pads are adapted to be readily attached to electrical conductors adapted to connect the dual RMS sensor to other items, such as the pins of a semiconductor cannister, as illustrated in FIG. 5 and hereinafter described.

The transistor areas of the dual RMS sensor die illustrated in FIGS. 2-4 are formed in a conventional manner, prior to the formation of the support leads and prior to the removal of the material in the resulting air or vacuum isolation region. Since detailed procedures for forming NPN transistors (or for that matter other semiconductor components or circuits) in <100> silicon and other wafers are well known, processes for forming such a component are not described here. The end result of such processes, as they apply to the present invention is the provision of a silicon chip or wafer covered with a protective layer 19 [silicon dioxide ($SiO_2$) in the case of a <100> silicon wafer] and having NPN transistors formed at desired regions in the wafer.

In accordance with the invention, a chip or wafer of the foregoing type, e.g. <100> silicon covered with $SiO_2$, first has suitable contacts 21 formed at all points where connection is to be made to the NPN transistors. This may be done in a <100> silicon wafer by forming windows in the SiO₂ layer where such contacts are to be made, depositing a layer of platinum, baking the layer so that platinum silicide forms where the platinum contacts the silicon (in the windows) and removing the platinum so as to leave platinum silicide in the windows. Next, using photolithographic techniques, e.g., depositing and etching, an adhesive layer 23 having resistive properties is created along the support lead paths and to form R1 and R2. The adhesive layer 23 in the support beam paths forms a thermal barrier between the platinum silicide contacts 21 and the next or support layer of the support leads. Preferably, the adhesive layer is formed of nichrome when resistive properties are needed, as is the situation when the islands are to include resistors such as R1 and R2. As hereinafter noted, when significant resistive properties are not needed, the adhesive layer can be formed of other materials, such as chrome or titanium.

The next layer of the support leads is a structural support layer 25, preferably, formed of 304 stainless steel. The structural support layer is formed over the adhesive layer and is the layer that provides the majority of the structural strength of the support leads. In addition, the structural support layer provides the electrical connection paths to the transistor and resistors. After the structural support layer 25 is formed, in the regions of the bonding pads only, a layer of platinum 27 is formed on the stainless steel. Next, a layer of gold 29 is formed on the platinum. These two metal layers provide bonding pads that allow the support leads to be readily wire bonded to the pins of a suitable housing, as hereinafter described. The geometrical boundaries of the various support lead and bonding pad layers are controlled by using standard photolithographic and photo resist processes, well known in the integrated circuit industry, during layer formation. Subsequent to the formation of the support leads, the air isolation region is formed by first removing the SiO₂ layer from between the support leads, except for where the frame and islands are to exist. Next, a selective anisotropic silicon etch in conjunction with standard photolithographic processes is used to remove the silicon wafer material from between the islands and the surrounding frame. The end result is a dual RMS sensor comprising a pair of islands air isolated from a surrounding frame, with the islands entirely supported by support leads running between the islands and the frame.

In summary, the process of the invention generally comprises the steps of: forming a semiconductor device (transistor or circuit) in a protectively coated, circuit quality wafer, preferably silicon with <100> crystal orientation, using standard semiconductor processing techniques; forming contact windows in the protective coating covering the wafer; forming contacts in the contact windows; creating an adhesive layer along paths extending outward from said contacts where support leads are to be formed; creating a structurally strong layer formed of a material of good electrical conductivity and poor thermal conductivity over the adhesive layer in regions where said support leads are to be formed; creating bonding pads on the structurally strong layer at predetermined points remote from said contacts; removing the protective layer from between said support leads, in regions lying between at least one island and a surrounding frame; and, removing the wafer material in an isolation region defined by said at least one island and said surrounding frame. In embodiments of the invention requiring resistors, preferably the adhesive layer is formed of a material having resistive properties and the resistors are formed at the same time the support lead adhesive layers are formed.

The foregoing paragraph has described the general process of the invention. There are a number of additional steps that may or may not be included, depending upon how the details of the invention are carried out. For example, in the absence of an infrared microscope or other suitable alignment tool, a few alignment holes are etched in the wafer from the protective layer side in a few selected places by an anisotropic silicon etch prior to the support leads being formed. The alignment holes are located at points where they will not conflict with the semiconductor device, support leads or resistors. The alignment holes are used to align the front and backside masks used during the subsequent processing steps. Thus, the alignment holes must be deep enough to extend through the resultant die. Specifically, if the backside of the die is to be lapped prior to the removal of the silicon in the isolation region, the alignment holes need only be deep enough to extend through the wafer after lapping is complete.

While the presently preferred adhesive layer material, when resistive properties are desired is a nickel chronimum alloy, commonly referred to as nichrome, other resistive materials can be used if desired. When resistance properties are of no particular consequence, materials such as chrome or titanium can be used to form the adhesive layers. Similarly, while the preferred structurally strong, high electrical conductivity, low thermal conductivity layer material is 304 stainless steel, other metals or metal alloys can be used, such as titanium, for example. In this regard, if desired, the adhesive and structurally strong layers of the support leads can be formed of a single material, such as titanium, that has both adhesive and structurally strong properties. In general, the support leads can be defined in terms of a figure of merit, which is defined as tensil strength divided by thermal conductivity. Using this definition, the support lead figure of merit for any materials chosen should be no less than 2,000 when tensil strength is given in terms of pounds per square inch (lbs/in²) and thermal conductivity is given in terms of BTU per square foot, hours, degrees Fahrenheit per foot (BTU/ft²hrs°F./ft). A further restriction is that the electrical resistivity ($\rho$) should be no more than 300 microhm-centimeters.

Moreover, while the use of selective anisotropic silicon etches to remove silicon are preferable to isotropic etches because the geometric definition of the resultant item is superior, in some cases the results provided by using isotropic etches may be adequate. In such cases, they can be used.

It will be appreciated from the foregoing description that a dual RMS sensor formed in accordance with the invention has a number of beneficial features. First, the islands are identical, because integrated circuit processing techniques have developed to the point where they are extremely precise. Thermal isolation is extremely high because the islands are air or vacuum separated from the surrounding surfaces. The only thermal paths existing are those created by the support leads. Since the metal used to form the structurally strong layer has low thermal conductivity, the thermal conductivity of the support lead paths is low.

In addition to thermal isolation, the dual RMS sensor is also thermally balanced. More specifically, as a result of the support leads all terminating atop the surrounding frame 13, any thermal difference between the support leads is balanced by the frame to some degree. (This thermal balance is further enhanced if the dual RMS sensor is mounted, on a ceramic substrate formed in the manner hereinafter described with respect to FIG. 5.) As a result thermal emf effects are reduced, if not entirely eliminated. Also external ambient temperature changes effect all support leads in the same manner. In essence, the frame 13 provides an isothermal platform for all of the support leads.

It will be appreciated by those skilled in the integrated circuit art that a dual RMS sensor formed in accordance with the invention can be made extremely small. For example, in one actual embodiment of the invention, the frame edge dimensions are 60 mil by 80 mil. The thickness of the silicon wafer is 0.003 inch and the thickness of the silicon oxide layer is 8,000 Å. In such embodiments, nichrome layer thickness in the 50 Å–5000 Å range; 304 stainless steel layer thickness in the 2000 Å–50,000 Å range; platinum bonding pad layer thickness in the 200 Å–6,000 Å range; and gold bonding pad layer thickness in the 1000 Å–50,000 Å range were found to be satisfactory.

From the foregoing discussion, it will be understood that, while the islands are air or vacuum isolated, some small amount of heat is dissipated. Such dissipation, of course, is necessary for the operation of the dual RMS sensor. Specifically, when the RMS value decreases it is necessary that the temperature of the island decrease. Such decrease occurs by heat traveling from the island to the frame via the support leads and from the islands via any gas in the surrounding environment. While the thermal conductance of the support leads is low, it is still adequate to remove some heat from the island. Of course, the greater the thermal resistance of the support leads, and the lower the number of gas molecules, the greater the response time of the islands to temperature changes created by a change in the RMS value. However, because the islands are small, the response time is not unduly high. Moreover, the response time can be reduced by making the islands even smaller.

It is pointed out here that because integrated circuit processing techniques are well known, a detailed list of all of the steps necessary to form a dual RMS sensor, or other thermally isolated monolithic semiconductor die, in accordance with the invention is not set forth. For example, an exact method of defining the geometrical orientation of the support leads and the manner of depositing the various layers are not described because many methods of definition and deposition exist. These methods include masking, sputter deposition, etching, plating, selective chemical etching etc. Further, certain semiconductor processing details, also well known in the integrated circuit art have not been set forth in detail. For example, various techniques can be utilized to remove excess silicon prior to removing the silicon in the isolation regions. In this regard, the die can be mounted on a ceramic wafer with black wax or a similar material such that the top side (i.e., support lead side) of the silicon wafer faces the ceramic wafer. The silicon wafer can then be lapped to the desired thickness, e.g., 0.003 inches thick. The front to back alignment holes previously etched into the wafer can then be used to orient a mask that defines the isolation regions. Thereafter, the silicon can be removed in these regions by etching the wafer with an anisotropic silicon etch (such as sodium hydroxide) as noted above.

It will also be recognized that a plurality of dual RMS sensor dies can be formed in a composite silicon wafer and die separation accomplished using an anisotropic silicon etch at the same time that the air or vacuum isolation regions are formed. In this case, of course, the $SiO_2$ layer is removed from around the die sections at the same time the $SiO_2$ layer is removed from the isolation regions. After the dies are formed and separated, the black wax holding the dies to the ceramic wafer is dissolved using a suitable solvent. The end result is a plurality of dual RMS sensors ready for packaging in a suitable container, as next described.

There is one additional feature illustrated in FIG. 2 that should be noted. Specifically, as will be appreciated by those familiar with integrated circuit electronics, as the AC input to the RMS sensor increases in frequency, capacitive coupling between the resistors and the emitter-base junctions of their related transistors becomes increasingly significant and, unless reduced or eliminated, can cause an error in the output. The invention reduces this problem by adding a guard in the form of an elbow G located between the resistors and their related transistors. The guard elbows G are formed simultaneously with the formation of the support leads of one of the resistors. It is this resistor lead that is connected to ground. Because the base of the related transistor and the elbow lead are connected to ground, a ground potential is formed about the emitter-base junction of the transistor. As a result capacitively coupled signals are grounded.

FIG. 5 is an exploded isometric diagram illustrating the packaging of a dual RMS sensor (or other semiconductor die) in accordance with the invention. The semiconductor package illustrated in FIG. 5 comprises: a header 31; a lid 33; and a ceramic substrate 35. The dual RMS sensor die 11 is supported by the ceramic substrate 35 and the ceramic substrate 35 is mounted on the header 31. The entire structure is enclosed by the metal lid 33. The header and the lid from a semiconductor cannister or housing, such as a TO-5 housing.

The ceramic substrate 35 is a support block that has a generally rectangular lower surface. The upper surface inclines upwardly from both of the ends of the substrate. The inclined portions 37 terminate at alignment ridges 39. The alignment ridges are raised elongate regions that lie orthogonal to the longitudinal length of the ceramic substrate 35. The portion 40 of the upper surface between the alignment ridges is paralled to the lower surface. Located in the center of the ceramic substrate, between the alignment ridges 39, is a well 41 that extends between the upper and lower surfaces. Located on either side of the well 41, along the non-ridged edge of the portion 40 of the upper surface between the ridges, are alignment mesas 43.

The dual RMS sensor die 11 is mounted on the ceramic substrate 35 between the alignment ridges and between the alignment mesas such that the frame is supported by the substrate and the islands lie above the well 41. Thus, the islands are air separated not only from the surrounding frame but also from the ceramic substrate. The alignment ridges 39 are spaced by a distance just equal to the length of the dual RMS sensor die. And, the alignment mesas 43 are spaced by a distance just equal to the width of the die. As a result of this dimensional arrangement, a dual RMS sensor die 11 is readily and quickly positioned in the correct position on the ceramic substrate 35 during assembly. The ceramic substrate 35 is readily and quickly positioned on the metal header 31, in the manner hereinafter described, as a result of circular indentations 45 included in the inclined surface ends of the ceramic substrate.

The metal header 31 is a conventional semiconductor or transistor cannister header and includes a raised circular center region or platform 47. Projecting through the platform at predetermined positions around the periphery of the platform are a plurality of connecting pins 49. The connecting pins are surrounded by insulation 51 that fills the region between the pins and the apertures 50 through which the pins pass. The insulation also fills the indentation in the header 31 created by the platform 47. Thus, each pin 49 is insulated from each other pin, and from the header 31. Since ten (10) pins are required to make connection to all of the bonding pads of the dual RMS sensor die 11, ten (10) pins 49 are positioned about the outer periphery of the platform 47.

The circular indentations 45 formed in the ends of the ceramic substrate 35 allow the ceramic substrate to be readily and quickly mounted between the appropriate pair of opposing pins 49. The appropriate pair is determined by their position with respect to an alignment tab 52 extending outwardly from the flange of the header 31. More specifically, the distance between the centers of the circular indentations is equal to the distance between a pair of opposing pins 49. Thus, the substrate is easily positioned, once the appropriate pair of pins are located. After the ceramic substrate and dual RMS sensor die are suitably positioned and bonded by a suitable adhesive in the appropriate position, fine wires are run from the tops of the pins to the bonding pads. Preferably the wires are formed of gold. The wires are attached at either end by welding, for example. The metal lid 33 is hat-shaped and formed such that the "brim" of the hat is attachable to the flange of the metal header 31 by any suitable attachment mechanism, such as adhesive bonding, soldering, welding, etc.

While the interior of the package can be left filled with air at atmospheric pressure, preferably, the interior is evacuated, because evacuation increases the thermal isolation benefits of the invention. More specifically, evacuation increases the mean-free path between any gas molecules left in the interior. As a result, thermal isolation is enhanced. Alternatively, the interior can be filled with an inert gas, such as nitrogen.

The package illustrated in FIG. 5 includes a number of beneficial features, some of which are discussed above, that should be noted. First, the inclusion of a well in the ceramic substrate beneath the islands keeps the islands away from all surrounding surfaces. This overall arrangement in and of itself increases the mean-free path that gas modules must pass through to convey heat away from the islands. In this regard, the well is approximately as deep as it is wide. In addition, the ceramic substrate assists in thermally equalizing the outer ends of the support leads because it attenuates temperature gradients from external sources. That is, because the ceramic substrate impinges on the entire periphery of the frame 13, which thermally equalizes the ends of the leads as a result of the frame's having good thermal conductance, ambient temperature changes tend to effect the frame in the same manner, whereby a thermal common mode effect takes place that prevents ambient temperature gradients from having different thermal effects on the islands.

It will be appreciated at this point that the dual RMS sensor of the invention and its package has a number of advantages not provided by prior art hybrid devices of a somewhat similar nature. For example, thermal isolation is very high and well controlled. While heat is lost through the support leads and through any atmospheric gas within the package, such heat loss is low. It can be further reduced by packaging in a vacuum. Heat conduction is maintained low by the choice of materials used to form the support leads. In this regard, as noted above, stainless steel is the preferred structural material. The thermal resistance of the support leads using this material can easily be above 1,000 degrees C per watt. Moreover, the formation of this large thermal resistance can be well controlled due to the inherent stability and re-repeatability of the photolithographic processes used to form the dual RMS sensor die. Such photolithic process also result in the thermal masses and thermal resistances of the islands being well matched. Moreover, since the ceramic substrate and the dual RMS sensor die are mounted on a metal header that is enclosed in a metal cap, both of which are good thermal conductors, an isothermal enclosure surrounds the entire assembly. This enclosure further enhances the sensor's immunity to external ambient temperature changes, and the fact that when temperature changes do have some effect on the isolated sections, the effect is minimal because both islands experience the same temperature change.

As noted above, the foregoing description has been directed to an improved RMS converter that includes a dual RMS sensor die formed in accordance with the invention. As also noted above, the process of the invention is not limited to the production of dual RMS sensor dies. Rather the process can be used to provide other thermally isolated monolithic semiconductor dies, such as radiation sensors. In this regard, attention is directed to FIGS. 6-8 and the following description.

Figure 6:
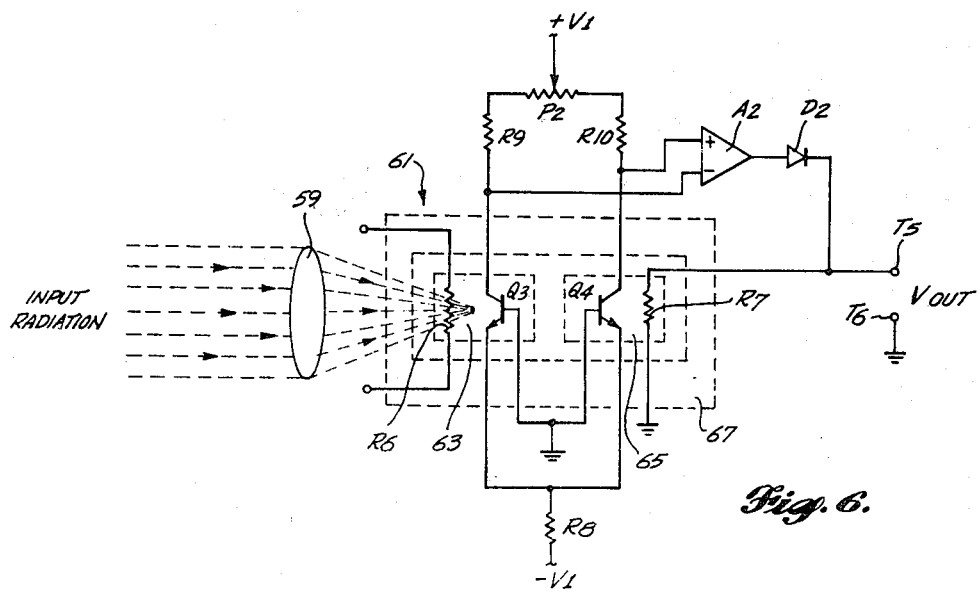
FIG. 6 is a schematic diagram of a radiation detector including a radiation sensor formed in accordance with the invention.

FIG. 6 is a schematic diagram of a radiation detector formed in accordance with the invention that includes a thermally isolated monolithic radiation sensor formed in accordance with the invention. That is, the radiation detector illustrated in FIG. 6 includes a radiation sensor 61 formed generally similar to the dual RMS sensor die 11 illustrated in FIG. 1 and previously discussed. The primary difference between these sensors is the manner of mounting the radiation sensor (illustrated in FIG. 7 and hereinafter described) and the manner of application of energy to the sensing island. In any event, the radiation sensor 61 illustrated in FIG. 6 includes a sensing island 63 and a balancing island 65 surrounded by a frame 67. Each island 63 and 65 includes a monolithic NPN transistor, designated Q3 and Q4, respectively. In addition, each island supports a thin film resistor, designated R6 and R7, respectively. The transistors, and the resistors are formed in the same manner as the transistors, Q1 and Q2, and resistors, R1 and R2, of the RMS sensor were formed. In addition, the sensing and balancing islands 63 and 65 are supported by support leads extending from the islands to the frame 67 in the same manner as the dual RMS sensor islands were supported. And, preferably, the support leads are formed in a similar manner. More specifically, the radiation sensor die 61 is, preferably, formed identically to the formation of the dual RMS sensor die. As a result, its manner of formation will not be further discussed.

As with the RMS converter, the radiation detector includes a bridge circuit formed partially by Q3 and Q4 of the radiation sensor. More specifically, the emitters of Q3 and Q4 are connected together and through a resistor designated R8 to a negative voltage source designated −V1. The collector of Q3 is connected through a resistor designated R9 to the inverting input of an operational amplifier designated A2 and to one end of a balancing potentiometer designated P2. The collector of Q4 is connected to the noninverting input of A2 and through a resistor designated R10 to the other end of P2. The sliding element of P2 is connected to a positive voltage source designated +V1. The output of A2 is connected to the anode of a diode designated D2. The cathode of D2 is connected to one end of R7. The other end of R7 is connected to ground. One output terminal designated T5 is connected to the cathode of D2 and the other output terminal designated T6 is connected to ground. The output voltage is a DC voltage and is designated $V_{OUT}$.

The sensing island resistor, R6, is unconnected. This resistor is only included so that the sensing and balancing islands 63 and 65 are identically formed. Rather than receiving input power via the sensing island resistor, R6, radiation is received via a lens 59. The lens is mounted so as to receive the radiation to be detected and image that radiation on the sensing island 63. More specifically, the lens 59 is a converging lens that is mounted so as to direct the radiation it receives onto the sensing island 63. The lens, for example, might be mounted so as to form the top of the lid 33 of a package of the type illustrated in FIG. 5.

The operation of the radiation detector illustrated in FIG. 6 is identical to the operation of the RMS converter illustrated in FIG. 1. That is, received radiation controls the temperature of the sensing island 63. This temperature is sensed by Q3. A2 compares the voltage at the collectors of Q3 and Q4, which are related to the temperatures of their respective islands. In accordance with this comparison A2 controls current flow through R7 such that the island temperature are maintained in balance. At balance, $V_{OUT}$ is proportional to the square root of the power in the received radiation. More specifically, the radiation power ($P_{IN}$) is equal to the square of the output voltage divided by the resistance of the heater resistor, R7. This can be stated mathematically as:

$$P_{IN} = V_{OUT}^2 / R_7$$

As will be readily appreciated by those skilled in the semiconductor art, if the radiation is imaged on the transistor side of the sensing island, the operation of Q3 could be disrupted or in error. In order to avoid this problem, the radiation sensor die is flipped over and mounted such that the received radiation is imaged on the backside of the sensing island. In this regard, attention is directed to FIG. 7.

FIG. 7 is a partial, cross-sectional, isometric view of a radiation sensor 61 mounted on a substrate 69. The substrate includes a well 71 over which the islands 63 and 65 are positioned, only the sensing island 63 being shown in FIG. 7. Extending outwardly from the well, atop the ceramic substrate, are a plurality of conductors 73. The conductors are positioned such that, about the well 71, one conductor is aligned with each bonding pad of the radiation sensor die when the die is flipped over. Prior to mounting the radiation sensor die 61, a beam lead 75 is bonded to or formed on each bonding pad so as to extend outwardly from the frame 67. The beam leads may, for example, comprise one (1) mil thick layers of plated gold. When the radiation sensor die is flipped over and positioned on the substrate 69, the beam leads 75 are aligned with related conductors 73. After being so aligned, the beam leads are bonded to the conductors. The conductors are, of course, connected to the pins of the package, preferably by thin wires similar to the thin wires used to connect the bonding pads of the dual RMS sensor die to the pins. Preferably, the ceramic substrate is formed and positioned such that the sensing island is located in the center of the package, rather than the overall die being centered. Such centering of the island provides for ease of focusing of the lens 59 mounted in the top of the package lid. Preferably, a "black" material that is opaque to (doesn't pass) and absorbs the radiation of the type to be sensed is deposited on the backside of the radiation sensor die in order to improve the conversion of radiant energy into heat. An example of a suitable black material is platinum oxide. Also, if desired, the backside can be textured by a suitable etch. The etch can be applied before or after the black material is deposited. For example, an etch could be applied, after black material deposition, just prior to the die being removed from the ceramic wafer that supports the die during the lapping and anisotropic etching steps described above.

FIG. 8 is a schematic diagram of an alternate embodiment of a radiation detector formed in accordance with the invention. The primary difference, in addition to circuit connection differences, between the FIG. 8 radiation detector and the FIG. 6 radiation detector resides in the nature of the radiation sensor. In the FIG. 8 radiation sensor no heater resistors are formed on the islands. Rather each island only includes a single monolithic NPN transistor.

More specifically, the radiation sensor 81 illustrated in FIG. 8 includes a sensing island 83 and a balancing island 85 surrounded by a frame 87. The sensing island includes a monolithic NPN transistor designated Q5 and the balancing island 85 includes a monolithic NPN transistor designated Q6. The base, emitter and collector terminals of the transistors are connected to the inner ends of support leads that extend from the respective islands 83 and 85 to the surrounding frame 87. As previously discussed, the support leads provide the entire support for the islands 83 and 85 as well as electrical connection to the transistor terminals. In this regard, the support leads are formed in the manner previously described, except, of course, in this instance, the adhesive layer can be formed of a material of low resistance, as discussed above.

The base of Q5 is connected through a resistor designated R11 to ground. The emitters of Q5 and Q6 are connected together and through a resistor designated R12 to a negative voltage source designated −V2. The collector of Q5 is connected to the inverting input of an operational amplifier designated A3 and through a resistor designated R13 to one end of a balancing potentiometer designated P3. The collector of Q6 is connected to the non-inverting input of A3 and through a resistor designated R14 to the other end of P3. The sliding element of P3 is connected to a positive voltage source designated +V2. The output of A3 is connected to an output terminal designated T7 and through a pair of series connected resistors, designated R15 and R16, to ground. The junction between R15 and R16 is connected to the base of Q6. A second output terminal designated T8 is connected to ground. The output voltage, taken across the T7/T8 terminals is designated $V_{OUT}$. Preferably, the resistance values of R13 and R14 are equal; and the resistance value of R11 is equal to the parallel resistance values of R15 and R16. Input radiation is imaged by an imaging lens 89 onto the backside of the sensing island 83.

The output voltage ($V_{OUT}$) of the circuit illustrated in FIG. 8 is proportional to the input power of the received radiation ($P_{IN}$) over a moderate temperature range. This relationship exists because the absolute value of a change in the base to emitter voltage of the transistors is proportional to the absolute change in temperature which, in turn, is proportional to $P_{IN}$ over a moderate temperature range.

FIG. 9 is a partially pictorial and partially schematic diagram illustrating another type of semiconductor die formed in accordance with the invention. Specifically, FIG. 9 illustrates a semiconductor die including a temperature stabilized thermal platform on which temperature sensitive elements are mounted. The temperature stabilized thermal platform 91 is formed as an island surrounded by a frame 93. The island and the frame are separated from one another by an air or vacuum isolation region 95. Monolithically formed in one region of the thermal platform 91 is a precision operational amplifier designated $A_T$. Support leads formed in the manner previously described extend between the frame 93 and the various terminals of $A_T$. More specifically, FIG. 9 illustrates five support leads running between the frame and $A_T$. Two of these leads supply positive and negative voltage to the positive and negative terminals of $A_T$. Two other support leads supply signals to the inverting and non-inverting inputs of $A_T$. The fifth support lead is connected to the output terminal of $A_T$.

Also monolithically formed in the thermal platform 91 is a temperature sensing NPN transistor designated $Q_S$. And, formed on the thermal platform in the manner previously described is a heating resistor designated $R_H$. Monolithically formed in the frame 93 is a control operational amplifier designated $A_C$. The frame also supports three thin film resistors designated R17, R18, and R19.

Support leads extend from the terminals of $Q_S$ and $R_H$ to the frame 93 to provide thermal platform support as well as electrical connection to $Q_S$ and $R_H$. The support lead connected to the base of $Q_S$ is connected to the support lead connected to the collector of $Q_S$ and the common terminal therebetween is connected to the non-inverting input of $A_C$ and through R17 to a voltage source designated $+V3$. The support lead connected to the emitter of $Q_S$ is connected to the support lead connected to one end of $R_H$, and the common connection therebetween is connected to ground. The support lead connected to the other end of $R_H$ is connected to the output of $A_C$. The inverting input of $A_C$ is connected through R19 to ground and through R18 to $+V3$.

It will be appreciated from the foregoing discussion and viewing FIG. 9 that $Q_S$, $R_H$, $A_C$, R19, R18 and R17 form a balancing circuit. Assuming appropriate component values are chosen, the thermal platform can be maintained at a predetermined temperature, determined by the resistance value of R19. After balance is achieved, if the temperature of the thermal platform changes, a corresponding change in the base-emitter voltage ($V_{be}$) of $Q_S$ changes. This change cause the output of $A_C$ to change. The $A_C$ output change is such that the current through $R_H$ (and thus the heat produced by $R_H$) changes in a compensating manner. As a result, the platform can be stabilized at some predetermined temperature, such as 80° centigrade, independent of package temperature changes or changes caused by the heat produced by $A_T$ as signal values change.

It will be appreciated that a thermal platform of the type illustrated in FIG. 9 can be made large enough to accommodate various types of critical circuitry that is temperature sensitive. Since the thermal platform, except for the nature of the circuitry being stabilized, is formed in the same manner as the islands were formed in the dual RMS sensor and radiation sensor dies previously described, a detailed description of the formation of the thermal platform is not set forth here. Also, since processes for monolithically forming the circuitry to be temperature stabilized in a silicon wafer or die are well known, such processes are not described here. However it will be appreciated that many circuits will have their performance improved if they are formed in a thermally isolated, temperature controlled thermal platform formed in accordance with the invention. Thus, it will be recognized that the operational amplifier die illustrated in FIG. 9 should be taken as illustrative and not limiting. In this regard, other circuits or components whose operation will be improved if they are formed in, or mounted on, a thermally isolated platform are reference zener diodes, reference amplifiers, transistors used for non-linear amplifiers such as log and anti-log amplifiers, band gap references and the front end stages of critical low drift amplifiers. The invention will improve the operation of these circuits and components by reducing the effect of ambient temperature changes by 1,000 or more. It should also be recognized that, if desired, the control amplifier $A_C$ also can be formed in, or mounted on, a thermally stabilized platform, rather than on the surrounding frame. Still further, only selected components of either or both amplifiers can be formed in, or mounted on, thermally isolated platforms. Thus, various changes can be made, not only with respect to the type of items to be combined with the thermal platform, but also within the specific structure illustrated in FIG. 9. It will also be recognized that the thermal isolation benefits of the invention reduce the power requirements needed by the circuit(s) or component(s) to achieve their designated functions.

It will be appreciated from the foregoing description that the invention provides a process for forming thermally isolated monolithic semiconductor devices. In addition, the invention includes devices formed in accordance with the process and improved circuits including such devices. While a wide variety of devices fall within the scope of the invention, they all include one or more islands surrounded by a frame and a plurality of support leads having high electrical conductivity and low thermal conductivity. The islands can be formed so as to have very small thermal masses, which is of particular importance when large thermal isolation is desired. Because integrated circuit photolithographic techniques are used, the resulting devices are geometrically very uniform. Uniform geometry is of particular importance when a pair of islands having matched characteristics are required. The silicon frame surrounding the island(s) is of particular significance because it reduces ambient temperature gradients and thermal emf effects. The mounting of dies formed in accordance with the invention on a unique ceramic mount that is suitable for mounting in a thermally conductive package provides additional thermal and thermal emf benefits, as discussed above. Thus, the invention includes a number of features each of which contribute to overall performance.

While preferred embodiments of the invention have been illustrated and described, it will be appreciated that various changes can be made therein without departing from the spirit and scope of the invention. Hence, the invention can be practiced otherwise than as specifically described herein.

The embodiments of the invention in which an exclusive property or privilege is claimed are defined as follows:

1. An RMS converter for converting the RMS value of an input signal into an output signal having a DC value equal to the RMS value of the input signal, said RMS converter comprising:
    a semiconductor die including a frame defining an aperture and first and second islands located in said aperture, each of said islands including a semiconductor component formed therein and a resistor formed thereon so as to be in thermal communication with the semiconductor component formed therein, said semiconductor die further including a plurality of support leads equal in number to the number of terminals defined by said semiconductor components and said resistors, said support leads extending outwardly from said islands to said frame so as to provide the sole support for said islands, each of said support leads including a layer of a structurally strong metal of high electrical conductivity and low thermal conductivity, said layer of structurally strong metal being substantially thicker than any other layer of said support leads;
    input circuit means for applying said RMS signal to the resistor on one of said islands via the support leads connected to said resistor;
    bridge means connected to said semiconductor components formed in said islands via said support leads connected to said semiconductor components such that said bridge means and said semiconductor components form a bridge circuit having a pair of opposed power terminals and a pair of opposed output terminals;
    comparison means connected to said pair of opposed output terminals of said bridge circuit for comparing the signals at said terminals and producing an output related to the difference therebetween;
    feedback means connecting the output of said comparison means to the resistor on said other island via said support leads connected to said resistor; and,
    output means connected to detect the voltage drop across said resistor on said other island, said voltage drop having a DC value equal to the RMS value of the signal applied to said resistor on said one of said islands.

2. An RMS converter as claimed in claim 1 wherein said semiconductor components are transistors.

3. An RMS converter as claimed in claim 2 wherein said support leads also include an adhesive layer located at the interface between said layer of said structurally strong metal and said islands and said frame.

4. An RMS converter as claimed in claim 3 wherein said comparison means is a differential amplifier.

5. An RMS converter as claimed in claim 1 wherein said support leads also include an adhesive layer located at the interface between said layer of said structurally strong metal and said islands and said frame.

6. An RMS converter as claimed in claim 1 wherein said comparison means is a differential amplifier.

7. A radiation sensor for providing an output signal having a DC value equal to the value of the energy in radiation received by said radiation sensor, said radiation sensor comprising:
    a semiconductor die including a frame defining an aperture and first and second islands located in said aperture, each of said islands including a semiconductor component formed therein, one of said islands coated in a predetermined region with a material that is opaque to and absorbs radiation of the type to be sensed, said semiconductor die further including a plurality of support leads equal in number to the number of terminals defined by said semiconductor components, said support leads extending outwardly from said islands to said frame so as to provide the sole support for said islands, each of said support leads including a layer of a structurally strong metal of high electrical conductivity and low thermal conductivity, said layer of structurally strong metal being substantially thicker than any other layer of said support leads;
    radiation imaging means for imaging radiation onto said coated region of said one of said islands;
    bridge means connected to said semiconductor components formed in said islands via said support leads connected to said semiconductor component such that said bridge means and said semiconductor components form a bridge circuit having a pair of opposed power terminals and a pair of opposed output terminals;
    comparison means connected to said pair of opposed output terminals of said bridge circuit for comparing the signals at said terminals and producing an output related to the difference therebetween;
    feedback means connecting the output of said comparison means to the semiconductor component formed in said other island via said support leads connected to said resistor; and,
    output means connected to detect the voltage drop across said semiconductor component formed in said other island, said voltage drop having a DC value equal to the value of the energy in the radiation imaged on said one of said islands by said radiation imaging means.

8. A radiation sensor as claimed in claim 7 wherein said semiconductor components are transistors.

9. A radiation sensor as claimed in claim 7 wherein said coated region is on the backside of said one of said islands.

10. A radiation sensor as claimed in claim 9 wherein said coating is platinum oxide.

11. A radiation sensor as claimed in claim 7 wherein said support leads also include an adhesive layer located at the interface between said layer of said structurally strong metal and said islands and said frame.

12. A radiation sensor for providing an output signal having a DC value equal to the energy in radiation received by said radiation sensor, said radiation sensor comprising:
    a semiconductor die including a frame defining an aperture and first and second islands located in said aperture, each of said islands including a semiconductor component formed therein and a resistor formed thereon so as to be in thermal communication with the semiconductor component formed therein, one of said islands coated in a predetermined region with a material that is opaque to and absorbs radiation of the type to be sensed, said semiconductor die further including a plurality of support leads equal in number to the number of terminals defined by said semiconductor components and said resistors, said support leads extending outwardly from said islands to said frame so as to provide the sole support for said islands, each of said support leads including a layer of a structurally strong metal of high electrical conductivity and low thermal conductivity, said layer of structurally strong metal being substantially thicker than any other layer of said support leads;

radiation imaging means for imaging radiation onto said coated region of said one of said islands;

bridge means connected to said semiconductor components formed in said islands via said support leads connected to said semiconductor component such that said bridge means and said semiconductor components form a bridge circuit having a pair of opposed power terminals and a pair of opposed output terminals;

comparison means connected to said pair of opposed output terminals of said bridge circuit for comparing the signals at said terminals and producing an output related to the difference therebetween;

feedback means connecting the output of said comparison means to the resistor on said other island via said support leads connected to said resistor; and, output means connected to detect the voltage drop across said resistor on said other island, said voltage drop having a DC value equal to the value of the energy in the radiation imaged on said one of said islands by said imaging means.

13. A radiation sensor as claimed in claim 12 wherein said semiconductor components are transistors.

14. A radiation sensor as claimed in claim 12 wherein said coated region is on the backside of said one of said islands.

15. A radiation sensor as claimed in claim 14 wherein said coating is platinum oxide.

16. A radiation sensor as claimed in claim 12 wherein said support leads also include an adhesive layer located at the interface between said layer of said structurally strong metal and said islands and said frame.

17. A detector circuit comprising:
a semiconductor die including a frame defining an aperture and first and second islands located in said aperture, said first island having a first transistor formed therein, said second island having a second transistor formed therein;

a plurality of support leads, including support leads for providing electrical connection to the base, emitter and collector electrodes of said first and second transistors, said plurality of support leads extending outwardly from said first and second islands to said frame to provide the sole support for said first and second islands, each of said support leads including a layer of a structurally strong metal of high electrical conductivity and low thermal conductivity, said layer of structurally strong metal being substantially thicker than any other layer within said support leads;

first circuit means connected to those support leads associated with the emitter electrodes of said first and second transistors, said first circuit means for coupling said emitter electrodes to an operating potential of first predetermined value;

second and third circuit means respectively connected to those support leads associated with the collector electrodes of said first and second transistors, said second and third circuit means for coupling said collector electrodes to an operating potential of second predetermined value; and signal comparison means having first and second input terminals and an output terminal, said first and second input terminals of said signal comparison means being respectively coupled to said support leads associated with said collector electrodes of said first and second transistors, said signal comparison means including means for supplying a signal to said output terminal that is representative of the difference between the signal levels coupled to said first and second input terminals.

18. The detector circuit of claim 17 adapted for use as an RMS converter for supplying a DC output signal of a value representative of the RMS value of the input signal, said detector circuit further comprising:
first and second resistors respectively formed on said first and second islands, said first resistor being positioned and arranged to be in thermal communication with said first transistor, said second resistor being positioned and arranged to be in thermal communication with said second transistor, said plurality of support leads including a support lead extending between said frame and each terminal of said first and second resistors;

fourth circuit means for coupling said input signal to those support leads associated with said first resistor;

fifth circuit means connected to those support leads associated with the base electrodes of said first and second transistors, said fifth circuit means being connected for commonly coupling said base electrodes of said first and second transistors to an operating potential of third predetermined value;

first and second output terminals for receiving said DC signal representative of said RMS value; and sixth circuit means connected to said second resistor, said sixth circuit means for coupling said signal representative of said RMS value of said input signal to said first and second output terminals, said sixth circuit means including means for coupling said output terminal of said signal comparison means to said first output terminal of said RMS sensor.

19. The detector circuit of claim 17 adapted for use as a radiation sensor for providing an output signal having a DC value representative of radiant energy received by said radiation sensor, said detector circuit further comprising:
a coating applied to at least a predetermined region of said first island, said coating being opaque to and absorbing radiation of the type to be sensed;

radiation imaging means for directing radiation impinging on said radiation sensor onto said coated region of said first island;

seventh and eighth circuit means for respectively coupling the support leads associated with the base electrodes of said first and second transistors to an operating potential of third predetermined value;

ninth circuit means connected for coupling a feedback signal from said output terminal of said signal comparison means to said support lead associated with said base electrode of said second transistor; and first and second output terminals for supplying said DC signal representative of said radiation, said first output terminal being coupled to said base electrode of said second transistor, said second output terminal being coupled to said operating potential of said third predetermined value.

20. The detector circuit of claim 16 adapted for use as a radiation sensor for providing an output signal having a DC value representative of radiant energy received by said radiation sensor, said detector circuit further comprising:

first and second resistors respectively formed on said first and second islands, said first resistor being positioned and arranged to be in thermal communication with said first transistor, said second resistor being positioned and arranged to be in thermal communication with said second transistor, said plurality of support leads including a support lead extending between said frame and each terminal of said first and second resistors;

tenth circuit means for commonly connecting those support leads associated with said base electrodes of said first and second transistors to an operating potential of third predetermined value;

a coating applied to at least a predetermined region of said first island, said coating being opaque to and absorbing radiation of the type to be sensed;

radiation imaging means for directing radiation impinging on said radiation sensor onto said coated region of said first island;

first and second output terminals for supplying said DC signal representative of said radiation, said first output terminal being coupled to the support lead associated with one terminal of said second resistor and being coupled to said output terminal of said signal comparison means, said second output terminal being connected to said operating potential of third predetermined value; and eleventh circuit means for coupling the support lead associated with the second terminal of said second resistor to said operating potential of said third predetermined value.

21. The detector circuit of claims 19 or 20 wherein said first and second transistors are formed from a first surface of said first and second islands and said coating is applied to a second surface of said first and second islands that is substantially parallel to said first surface.

* * * * *

UNITED STATES PATENT AND TRADEMARK OFFICE
CERTIFICATE OF CORRECTION

PATENT NO. : 4,346,291
DATED : August 24, 1982
INVENTOR(S) : Roy W. Chapel, Jr., et al.

It is certified that error appears in the above-identified patent and that said Letters Patent are hereby corrected as shown below:

Abstract, line 1: after "isolated" insert --monolithic--
Column 2, line 24: "well known" is changed to --well-known--
Column 3, line 27: "radiaion" is changed to --radiation--
Column 6, line 62: insert "," (comma) after --invention--
Column 8, line 26: insert "," (comma) after --desired--
Column 10, line 41: "from" is changed to --form--
Column 11, line 63: "frame's" is changed to --frame--
Column 12, line 2: "has" is changed to --have--
Column 12, line 18: "result" is changed to --results--
Column 13, line 39: "temperature" is changed to --temperatures--
Column 15, line 65: "cause" is changed to --causes--

Signed and Sealed this

Twenty-first Day of December 1982

[SEAL]

Attest:

GERALD J. MOSSINGHOFF

Attesting Officer  Commissioner of Patents and Trademarks